United States Patent
Chinthu et al.

(10) Patent No.: US 12,407,350 B2
(45) Date of Patent: *Sep. 2, 2025

(54) VOLTAGE LEVEL SHIFTER WITH PROGRAMMABLE HIGH SUPPLY VOLTAGE AND HIGH SUPPLY VOLTAGE-DEPENDENT VARIABLE LOW SUPPLY VOLTAGE

(71) Applicant: GlobalFoundries U.S. Inc., Malta, NY (US)

(72) Inventors: Siva Kumar Chinthu, Bangalore (IN); Venkatesh Periyapatna Gopinath, Fremont, CA (US); Suresh Pasupula, Bangalore (IN); Devesh Dwivedi, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 176 days.

This patent is subject to a terminal disclaimer.

(21) Appl. No.: 18/350,305

(22) Filed: Jul. 11, 2023

(65) Prior Publication Data

US 2025/0023564 A1    Jan. 16, 2025

(51) Int. Cl.
*H03K 19/0175* (2006.01)
*H03K 19/00* (2006.01)
*H03K 19/003* (2006.01)

(52) U.S. Cl.
CPC . *H03K 19/017581* (2013.01); *H03K 19/0013* (2013.01); *H03K 19/0016* (2013.01); *H03K 19/00384* (2013.01)

(58) Field of Classification Search
CPC ........... H03K 19/0013; H03K 19/0016; H03K 19/00384; H03K 19/017581;
(Continued)

(56) References Cited

U.S. PATENT DOCUMENTS

| | | | |
|---|---|---|---|
| 4,149,232 | A | 4/1979 | Eaton, Jr. |
| 5,059,815 | A | 10/1991 | Bill et al. |

(Continued)

FOREIGN PATENT DOCUMENTS

EP    4072015 A1    12/2022

OTHER PUBLICATIONS

U.S. Appl. No. 18/350,316, Office Action dated Oct. 9, 2024, 12 pages.

(Continued)

*Primary Examiner* — Jason M Crawford
(74) *Attorney, Agent, or Firm* — David Cain; Hoffman Warnick LLC (57) ABSTRACT

A disclosed circuit structure includes a voltage level shifter connected to a variable voltage generator for receiving a low supply voltage and to a programmable voltage generator for receiving a high supply voltage that is higher than the low supply voltage. The high supply voltage is programmable to one of multiple different voltage levels. The variable voltage generator tracks the voltage level of the high supply voltage and outputs the low supply voltage based thereon. The high supply voltage is tracked either directly or using the trim bit signal employed by the programmable voltage generator to program the high supply voltage. The low supply voltage is high when the high supply voltage is high to ensure operation within the safe operating area and is low when the high supply voltage drops below some threshold level to ensure operability and, optionally, improve operating speed.

20 Claims, 5 Drawing Sheets

(58) Field of Classification Search
CPC ... H03K 19/018507; H03K 19/018521; H03K 19/018585; H03K 19/20

See application file for complete search history.

(56) References Cited

U.S. PATENT DOCUMENTS

| | | | |
|---|---|---|---|
| 5,436,587 | A | 7/1995 | Cernea |
| 5,734,286 | A | 3/1998 | Takeyama et al. |
| 6,028,473 | A | 2/2000 | Kamei et al. |
| 6,046,626 | A | 4/2000 | Saeki et al. |
| 6,046,627 | A * | 4/2000 | Itoh ................. G11C 5/146 327/544 |
| 6,099,100 | A | 8/2000 | Lee |
| 6,160,723 | A | 12/2000 | Liu |
| 6,191,963 | B1 | 2/2001 | McPartland et al. |
| 6,356,469 | B1 | 3/2002 | Roohparvar et al. |
| 6,392,905 | B1 | 5/2002 | Huang et al. |
| 6,483,728 | B1 | 11/2002 | Johnson et al. |
| 6,525,949 | B1 | 2/2003 | Johnson et al. |
| 6,570,434 | B1 | 5/2003 | Hsu et al. |
| 6,747,897 | B2 | 6/2004 | Karaki |
| 6,819,162 | B2 | 11/2004 | Pelliconi |
| 6,922,096 | B2 | 7/2005 | Cernea |
| 6,995,603 | B2 | 2/2006 | Chen et al. |
| 7,116,156 | B2 | 10/2006 | Myono et al. |
| 7,710,183 | B2 | 5/2010 | Chaba et al. |
| 8,049,553 | B2 | 11/2011 | Kim et al. |
| 8,476,963 | B2 | 7/2013 | Cook et al. |
| 8,963,624 | B2 | 2/2015 | Murakami |
| 9,013,229 | B2 | 4/2015 | Rahman et al. |
| 9,160,930 | B2 | 10/2015 | Ishii |
| 9,306,450 | B2 | 4/2016 | Emira et al. |
| 9,548,655 | B2 | 1/2017 | Ersoy et al. |
| 10,355,694 | B1 | 7/2019 | Kumar |
| 10,498,230 | B1 | 12/2019 | Chen et al. |
| 10,911,047 | B1 | 2/2021 | Shetty et al. |
| 11,139,004 | B2 | 10/2021 | Sinha et al. |
| 11,277,121 | B1 | 3/2022 | Goyal et al. |
| 11,569,738 | B1 | 1/2023 | Chinthu |
| 11,569,838 | B2 | 1/2023 | Chinthu |
| 11,671,080 | B1 | 6/2023 | Ross et al. |
| 11,843,374 | B2 | 12/2023 | Lee |
| 2008/0012627 | A1 | 1/2008 | Kato |
| 2009/0134929 | A1 * | 5/2009 | Luo ................. H03K 3/012 327/333 |
| 2010/0309716 | A1 | 12/2010 | Tsukada |
| 2010/0327959 | A1 | 12/2010 | Lee |
| 2014/0132329 | A1 | 5/2014 | Li et al. |
| 2019/0379365 | A1 | 12/2019 | Hsu et al. |
| 2025/0023564 | A1 * | 1/2025 | Chinthu ........... H03K 19/00384 |
| 2025/0023566 | A1 * | 1/2025 | Chinthu ................. H03K 19/20 |

OTHER PUBLICATIONS

U.S. Appl. No. 18/350,327, Notice of Allowance dated Jan. 27, 2025, 8 pages.

Ballo et al., "A Review of Charge Pump Topologies for the Power Management of IoT Nodes," MDPI Electronics, 8, 480, 2019, pp. 1-15.

Cavalheiro et al., "Insights into Tunnel FET-Based Charge-Pumps and Rectifiers for Energy Harvesting Applications," IEEE Transactions on Very Large Scale Integration (VLSI) Systems, vol. 25, Issue 3, 2017, pp. 1-11.

Chen et al., "A Sub-100mV Ultra-Low Voltage Level-Shifter Using Current Limiting Cross-Coupled Technique for Wide-Range Conversion to I/0 Voltage," IEEE Access, vol. 8, published Aug. 6, 2020, pp. 145577-145585.

Lanuzza et al., "Low-Power Level Shifter for Multi-Supply Voltage Designs," IEEE Transactions on Circuits and Systems—II: Express Briefs, vol. 59, No. 12, Dec. 2012, pp. 922-926.

Pan et al., "A Low Voltage to High Voltage Level Shifter Circuit for MEMS Application," IEEE, In Proceedings of the 15th Biennial University/Government/Industry Microelectronics Symposium, Jul. 2003, pp. 128-131.

Pelliconi et al., "Power Efficient Charge Pump in Deep Submicron Standard CMOS Technology," IEEE Journal of Solid-State Circuits, vol. 38, No. 6, Jun. 2003, pp. 1068-1071.

U.S. Appl. No. 17/488,380, Office Action dated Apr. 28, 2022, 11 pages.

U.S. Appl. No. 17/488,380, Response to Office Action submitted May 27, 2022, 19 pages.

U.S. Appl. No. 17/488,380, Final Office Action dated Aug. 31, 2022, 13 pages.

U.S. Appl. No. 17/488,380, Response to Final Office Action submitted Sep. 26, 2022, 21 pages.

U.S. Appl. No. 17/488,380, 2nd After Final Response dated Oct. 5, 2022, 10 pages.

U.S. Appl. No. 17/488,380, Advisory Action dated Oct. 5, 2022, 17 pages.

U.S. Appl. No. 17/488,380, Notice of Allowance dated Oct. 21, 2022, 9 pages.

Extended European Search Report for Related EP Application No. 24151286.2-1201 dated Jun. 14, 2024, 11 pages.

U.S. Appl. No. 18/350,316, Final Office Action dated Mar. 10, 2025, 13 pages.

U.S. Appl. No. 18/350,294, filed Jul. 11, 2023, 38 pages.

U.S. Appl. No. 18/350,316, filed Jul. 11, 2023, 47 pages.

U.S. Appl. No. 18/350,327, filed Jul. 11, 2023, 59 pages.

U.S. Appl. No. 18/350,316, Amendment to Office Action filed Dec. 9, 2024, 15 pages.

U.S. Appl. No. 18/350,316, Notice of Allowance dated Apr. 4, 2025, 9 pages.

U.S. Appl. No. 18/350,294, Office Action dated May 6, 2025, 13 pages.

U.S. Appl. No. 18/350,294, Response to Office Action filed Jul. 3, 2025, GF2022323-US-NP, 15 pages.

* cited by examiner

VOLTAGE LEVEL SHIFTER WITH PROGRAMMABLE HIGH SUPPLY VOLTAGE AND HIGH SUPPLY VOLTAGE-DEPENDENT VARIABLE LOW SUPPLY VOLTAGE

BACKGROUND

The present disclosure relates to on-chip voltage level shifters and, more particularly, to embodiments of a voltage level shifter with a programmable high positive supply voltage.

Considerations in modern integrated circuit (IC) design include, but are not limited to, performance improvement, size scaling, and power consumption. Oftentimes design changes to improve one aspect of the design can yield an undesirable trade-off with respect to other aspects of the design. For example, a voltage level shifter in an IC design may be configured to translate (i.e., shift) a voltage signal from one logic level or voltage domain to another. Voltage level shifter designs have been developed that include low voltage transistors to reduce power consumption. However, at least some of the low voltage transistors in these voltage level shifters tend to quickly operate outside the safe operating area (SOA). Design modifications intended to avoid operation outside the SOA have included, for example, the use of asymmetric high voltage transistors (e.g., laterally diffused metal oxide semiconductor field effect transistors (LDMOSFETs)) in place of at-risk low voltage transistors and/or the use of a discrete biasing circuit. While such design modifications may help to avoid operation outside the SOA, they also add to circuit complexity, power consumption, and area.

SUMMARY

Disclosed herein are embodiments of a structure. The structure includes a voltage level shifter with a low supply voltage node and a high supply voltage node. The structure further includes a programmable voltage generator that outputs a high supply voltage to the high supply voltage node and a variable voltage generator that outputs a low supply voltage to the low supply voltage node. The low supply voltage output by the variable voltage generator can specifically be dependent on and lower than the high supply voltage.

In some embodiments, the structure can include a voltage level shifter with a low supply voltage node and a high supply voltage node. The structure can further include a programmable voltage generator that receives a trim bit signal and, based on the trim bit signal, outputs a high supply voltage to the high supply voltage node. The structure can further include a variable voltage generator that outputs a low supply voltage to the low supply voltage node. In order to set the voltage level of the low supply voltage, the variable voltage generator can also receive the trim bit signal and, based on the trim bit signal, can generate and output the low supply voltage such that it is lower than the high supply voltage.

In other embodiments, the structure can include a voltage level shifter with a low supply voltage node and a high supply voltage node. The structure can further include a programmable voltage generator that outputs a high supply voltage to the high supply voltage node. The structure can also include a variable voltage generator that outputs a low supply voltage to the low supply voltage node. In order to set the voltage level of the low supply voltage, the variable voltage generator can receive the high supply voltage, internally generate a a trim bit signal based on the high supply voltage, and further generate and output the low supply voltage based on the trim bit signal so it is lower than the high supply voltage.

BRIEF DESCRIPTION OF THE DRAWINGS

The present disclosure will be better understood from the following detailed description with reference to the drawings, which are not necessarily drawn to scale and in which.

DETAILED DESCRIPTION

As mentioned above, considerations in modern integrated circuit (IC) design include, but are not limited to, performance improvement, size scaling, and power consumption. Oftentimes design changes to improve one aspect of the design can yield an undesirable trade-off with respect to other aspects of the design. For example, a voltage level shifter in an IC design may be configured to translate (i.e., shift) a voltage signal from one logic level or voltage domain to another. Voltage level shifter designs have been developed that include low voltage transistors to reduce power consumption. However, at least some of the low voltage transistors in these voltage level shifters tend to quickly operate outside the safe operating area (SOA). Design modifications intended to avoid operation outside the SOA have included, for example, the use of asymmetric high voltage transistors (e.g., laterally diffused metal oxide semiconductor field effect transistors (LDMOSFETs)) in place of at-risk low voltage transistors and/or the use of a discrete biasing circuit. While such design modifications may help to avoid operation outside the SOA, they also add to circuit complexity, power consumption, and area.

In view of the foregoing, disclosed herein are embodiments of a circuit structure that includes a voltage level shifter, a variable voltage generator, and a programmable voltage generator. The voltage level shifter can include a low supply voltage node, a high supply voltage node, and parallel branches, including multiple transistors, connected between the low and high supply voltage nodes. The variable voltage generator can generate a variable low supply voltage (VL) and can apply VL to the low supply voltage node. The programmable voltage generator can generate a programmable high supply voltage (VH) and can apply VH to the high supply voltage node. The VH can be any of multiple (e.g., up to three) different VH levels (e.g., a relatively low first VH level of 1.8 volts (V), a relatively high second VH level of 3.6V, and a mid-level third VH level between the first and second VH levels, such as at 2.6V). The variable voltage generator can be configured to track the voltage level of VH and to adjust the voltage level of VL based thereon. In some embodiments, such tracking can be performed using a trim bit signal employed by the programmable voltage generator (e.g., a charge pump thereof) when programming VH. In other embodiments such tracking can be achieved by direct monitoring of VH. In either case, VL can be lower than VH and the variable voltage generator can increase VL from a relatively low first VL level (e.g., of 0.8V) to a relatively high second VL level (e.g., of 1.8 volts (V)) in response to a relatively high second VH (e.g., of 3.6V) to ensure operation within the safe operating area (SOA). The variable voltage generator can further decrease VL from the second VL level (e.g., of 1.8V) back to the first VL level (e.g., of 0.8V) when VH drops to the first VH level (e.g., of 1.8V) to ensure that the voltage level shifter remains operable and, optionally, even when VH drops to the mid-level third VH level (e.g., of 2.6V) to improve operating speed.

Figure 1:
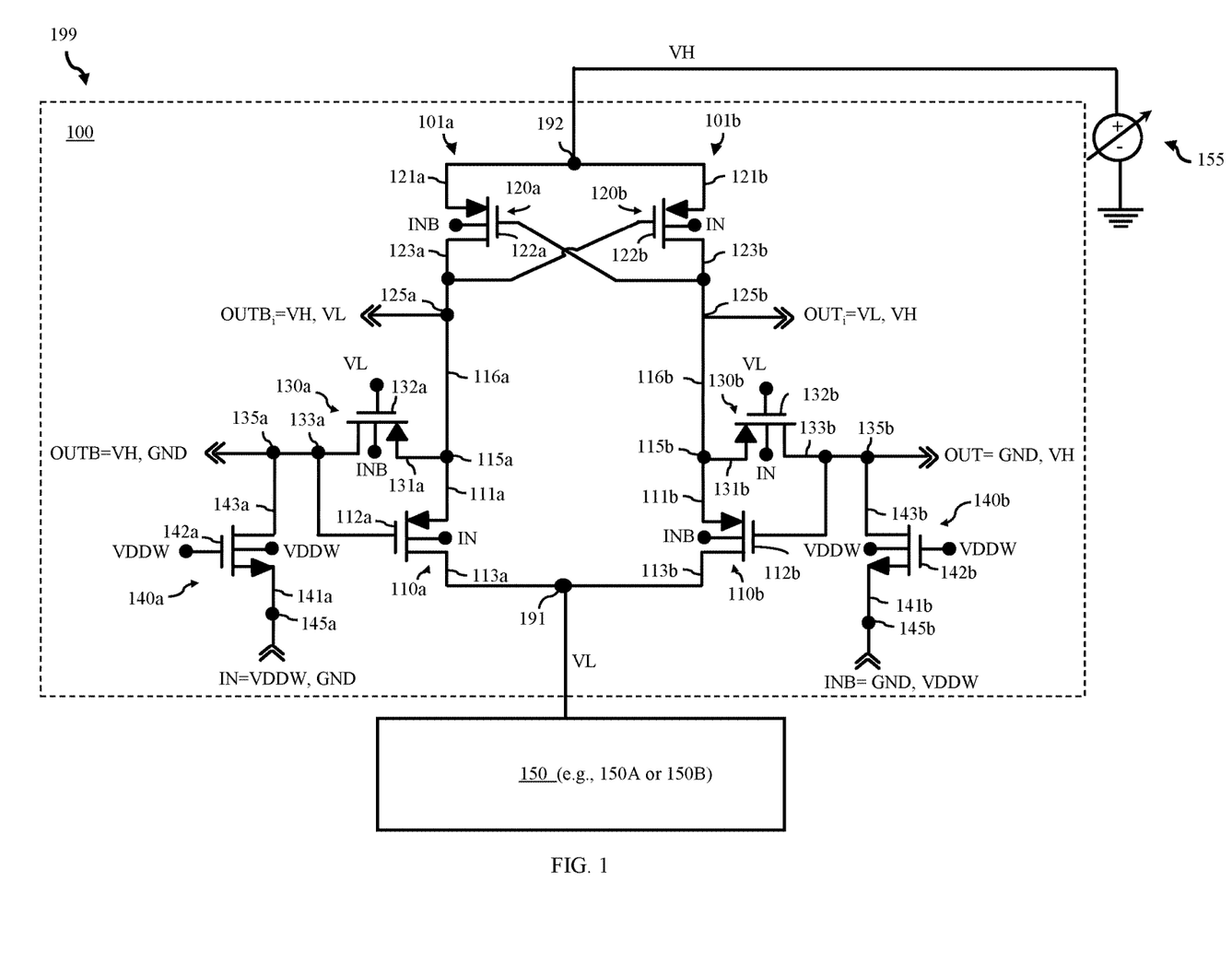
FIG. 1 is a circuit diagram illustrating embodiments of a disclosed structure.

FIG. 1 is a schematic diagram generally illustrating embodiments of a circuit structure 199 including a voltage level shifter 100, a programmable voltage generator 155, and a variable voltage generator 150.

The voltage level shifter 100 can, for example, include multiple transistors. As discussed in greater detail below, these transistors can include both P-type transistors and N-type transistors. For purposes of illustration, the P-type transistors and N-type transistors are described below and illustrated in the figures as being metal oxide semiconductor field effect transistors (MOSFETs) and, particularly, P-type field effect transistors (PFETs) and N-type field effect transistors (NFETs), respectively. A MOSFET refers to a transistor with a semiconductor channel region positioned laterally between a source region and a drain region and with a gate (e.g., including a gate dielectric-gate conductor stack) adjacent to the channel region. However, the figures and discussion thereof are not intended to be limiting. For example, alternatively, a similar circuit structure could be formed using bipolar junction transistors (BJTs) and, particularly, PNP BJTs and NPN BJTs. The transistors can, for example, all have the same maximum voltage rating (VDDW) and, for reduced power consumption, VDDW can be relatively low as specified by the transistor data sheet. For example, the transistors can have a maximum voltage rating of 3.3V or lower. In some embodiments, the transistors can have a maximum voltage rating of 1.8V, 1.5V or 0.8V. To minimize manufacturing complexity, the transistors can all be symmetric. That is, they can be designed so that the source region and the drain region are the same (e.g., same size, doping, etc.) except for minor process variations and so that the same maximum voltage rating applies to the gate-source voltage (VGS), the gate-drain voltage (VGD), and the drain-source voltage (VDS). As discussed in greater detail below, the voltage level shifter 100 can specifically be configured to achieve voltage level shifting without violating any of these maximum voltage ratings in order to avoid device stress and ensure operation within the SOA.

For purposes of illustration, examples provided herein are generally based on all transistors having a 1.8V maximum voltage rating. Additionally, various components of the circuit structure can, as discussed in greater detail below, be connected to receive fixed supply voltages. The fixed supply voltages available to the circuit structure can include but are not limited to: a fixed supply voltage (VDDW), which is set at a voltage level equal to the maximum voltage rating of the transistors (e.g., VDDW=1.8V), and an additional fixed supply voltage (VDDC), which is set at a voltage level between ground and VDDW. For example, VDDC can be essentially ½ the magnitude of VDDW, less than ½ the magnitude of VDDW, etc. For example, if VDDW=1.8V, VDDC=0.8V.

The programmable voltage generator 155 can be configured to generate and output a programmable high supply voltage (VH) and the variable voltage generator 150 can be configured to generate and output a variable VH-dependent low supply voltage (VL). The voltage level shifter 100 can include a high supply voltage node, which is electrically connected to the programmable voltage generator 155 for receiving VH, and a low supply voltage node 191, which is electrically connected to the variable voltage generator 150 for receiving VL.

More specifically, the programmable voltage generator 155 can be configured to output VH at a relatively low first VH level, a relatively high second VH level, and, optionally, at some medium-level third VH level (between the first and second VH levels). The programmable voltage generator 155 can be configured so that the second VH level is essentially double the magnitude of VDDW, so that the first VH level is equal to VDDW and, if applicable, so that the third VH level is somewhere between the first and second VH levels. For example, in some embodiments, VDDW is 1.8V, the first VH level is 1.8V, the second VH level is 3.6V, and, if applicable, the third VH level is 2.6V. For purposes of this disclosure, "essentially double" the magnitude refers to twice the magnitude, plus or minus 10% thereof (e.g., if VDDW is 1.8V, then the high VH=3.6V+/−0. 36V, etc.). Programmable voltage generators configured to output different supply voltages are well known in the art and, thus, the details thereof have been omitted from this specification in order to allow the reader to focus on the salient aspects of the disclosed embodiments. However, those skilled in the art will recognize that, typically, a programmable voltage generator will include a charge pump configured to convert an input direct current (DC) power supply to one or more different DC power supplies and the state of a trim bit signal (TRIM) received by the programmable voltage generator will dictate the level of VH output to a particular supply voltage node (in this case to the high supply voltage node 192). For example, for a two-VH level programmable voltage generator, a single-bit two-state TRIM can control whether a high VH or a low VH is output to the high supply voltage node 192. When TRIM is at a high logic level (i.e., a "1" logic level or a logic 1), the high VH can be output to the second supply node 192 and, when TRIM is at a low logic level (i.e., a "0" logic level or logic 0), the low VH can be output to the second voltage node 192. For a three-VH programmable voltage generator, a tri-state single-bit TRIM can control whether a high VH, a mid-level VH, or a low VH is output to the high supply voltage node 192. When TRIM is at logic 1, the high VH can be output to the second supply node 192. When TRIM is at logic 0, the mid-level VH can be output to the second voltage node 192. When TRIM is at a high impedance (i.e., high Z) state, the low VH can be output to the second voltage node 192.

The variable voltage generator 150 can be configured to track the voltage level of VH and generate and output VL depending upon the voltage level of VH (i.e., to generate and output a VH-dependent VL) in order to, for example, ensure voltage level shifter transistor operation within the SOA when VH is high, to ensure voltage level shifter operability when VH is low and, if applicable, to improve operating speed when VH is at some mid-level. In some embodiments, such tracking can be performed by the variable voltage generator 150 using an external trim bit signal (TRIM) employed by the programmable voltage generator 155 when programming VH. In another embodiment such tracking can be achieved by direct monitoring of VH.

Figure 2:
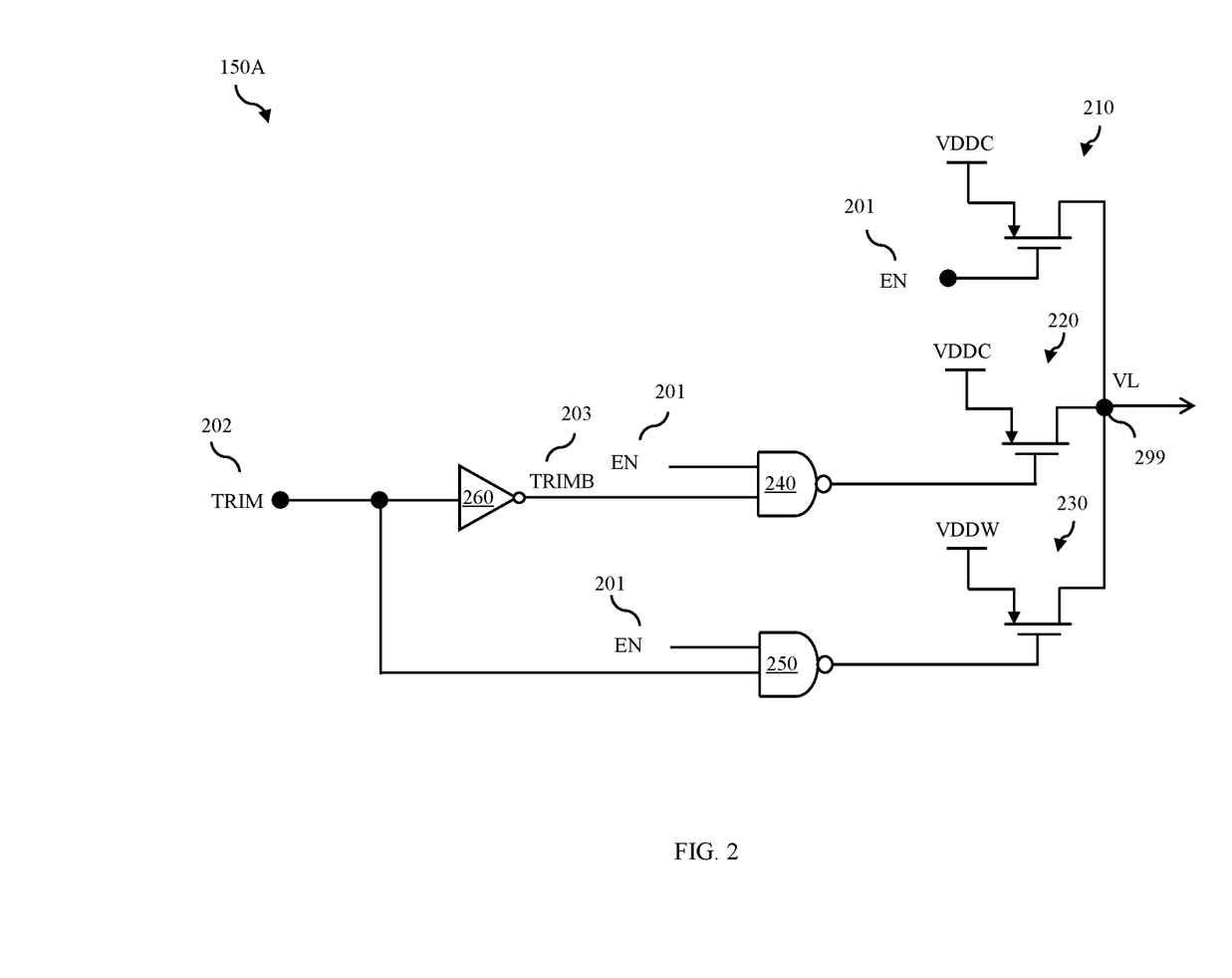
FIG. 2 is a circuit diagram illustrating an example of a variable voltage generator that can be incorporated into the structure of FIG. 1.

FIG. 2 is a schematic diagram illustrating one example of a variable voltage generator 150A that can be incorporated into circuit structure 199 of FIG. 1 for supplying a VH-dependent VL to the low supply voltage node 191 of the voltage level shifter. In this example, the variable voltage generator 150A is configured to track VH using TRIM 202, which is externally generated and also employed by the programmable voltage generator 155 to establish the voltage level of VH. The variable voltage generator 150A is further configured to generate and output VL at a first VL level (e.g., at 0.8V) or at a higher second VL level (e.g., at 1.8V) depending upon the state of TRIM 202 as well as the state of an enable signal (EN) 201.

In the disclosed embodiments, the circuit structure 199 can, for example, be incorporated into a memory circuit, such as a resistive random access memory (RRAM) circuit. In this case, EN can be a write enable signal, which is high during a write mode, and which is low during a read mode. For example, when EN 201 is at logic 0 and TRIM 202 is at a high-Z state (e.g., indicating that the programmable voltage generator 155 is outputting VH at the low first VH level, such as at 1.8V) or when EN 201 is at logic 1 and TRIM is at logic 0 (e.g., indicating that the programmable voltage generator 155 is outputting VH at a medium third VH level, such as a 2.6V), the variable voltage generator 150A can output VL at the low first VL level (e.g., at 0.8V). However, when EN 201 and TRIM 202 are both at logic 1 (e.g., indicating that the programmable voltage generator 155 is outputting VH at the high second VH level, such as at 3.6V), the variable voltage generator 150A can output VL at the high second VL level (e.g., at 1.8V).

More specifically, the variable voltage generator 150A can include: an inverter 260; a pair of NAND gates (i.e., a first NAND gate 240 and a second NAND gate 250); three PFETs (i.e., a first PFET 210, a second PFET 220, and a third PFET 230); and an output voltage node 299. The output voltage node 299 can be electrically connected to the low supply voltage node 191 of the voltage level shifter 100 for supplying VL to the low supply voltage node 191. The first PFET 210 can include: a source region, which is electrically connected to receive VDDC; a drain region, which is electrically connected to the output voltage node 299; and a gate, which is electrically connected to receive EN 201. The second PFET 220 can include: a source region, which is electrically connected to receive VDDC; a drain region, which is electrically connected to the output voltage node 299; and a gate, which is electrically connected to receive an output signal from the first NAND gate 240. The third PFET 230 can include: a source region, which is connected to receive VDDW; a drain region, which is connected to the output voltage node 299; and a gate, which is electrically connected to receive an output signal from the second NAND gate 250. The inverter 260 can be electrically connected to receive, as an input, the externally generated TRIM 202 and can be configured to output an inverted trim bit signal (TRIMB) 203 (i.e., TRIMB 203 can be inverted with respect to TRIM 202). The first NAND gate 240 can be electrically connected to receive, as inputs, EN 201 and TRIMB 203, respectively, and can be configured to output a first NAND gate output signal (according to a conventional NAND gate truth table). The second NAND gate 250 can be electrically connected to receive, as inputs, EN 201 and TRIM 202, respectively, and can be configured to output a second NAND gate output signal (according to a conventional NAND gate truth table).

Those skilled in the art will recognize that a conventional NAND gate truth table specifies that when the inputs to a NAND gate are both low (i.e., 00) or are different (e.g., 01 or 10), then the NAND gate output signal will be high. When the inputs to the NAND gate are both at high (i.e., 11), then the NAND gate output signal will be low (i.e., 0).

In operation, the on/off state of the first PFET 210 is controlled by EN 201, the on/off state of the second PFET 220 is controlled by the output signal from the first NAND gate 240, and the on/off state of the third PFET 230 is controlled by the output signal from the second NAND gate 250. When EN is low, the PFET 210 will turn on. Additionally, the output signals from the first and second NAND gates 240 and 250 will both be high so the second PFET 220 and the third PFET 230 will be turned off. Thus, a VL at the low first VL level of VDDC (e.g., at 0.8V) will be supplied by the first PFET 210 to the output voltage node 299 and, thereby to the low supply voltage node 191 of the voltage level shifter 100. When EN 201 is high, TRIM 202 is low, and TRIMB 203 is high, the first PFET 210 will turn off, the output signal from the second NAND gate 250 will be high so the third PFET 230 will turn off, and the output signal from first NAND gate 240 will be low so the second PFET 220 will turn on. Thus, a VL at the low first VL level of VDDC is supplied through the second PFET 220 to the output voltage node 299 and, thereby to the low supply voltage node 191 of the voltage level shifter 100. Finally, when EN 201 is high, TRIM 202 is high, and TRIMB 203 is low, the first PFET 210 is off, the output signal from the first NAND gate 240 will be high so the second PFET 220 is off, and the output signal from the second NAND gate 250 will be low so the third PFET 230 turns on. Thus, a VL at the high second VL level of VDDW (e.g., at 1.8V) is supplied through the third PFET 230 to the output voltage node 299 and, thereby to the low supply voltage node 191 of the voltage level shifter 100.

Figure 3:
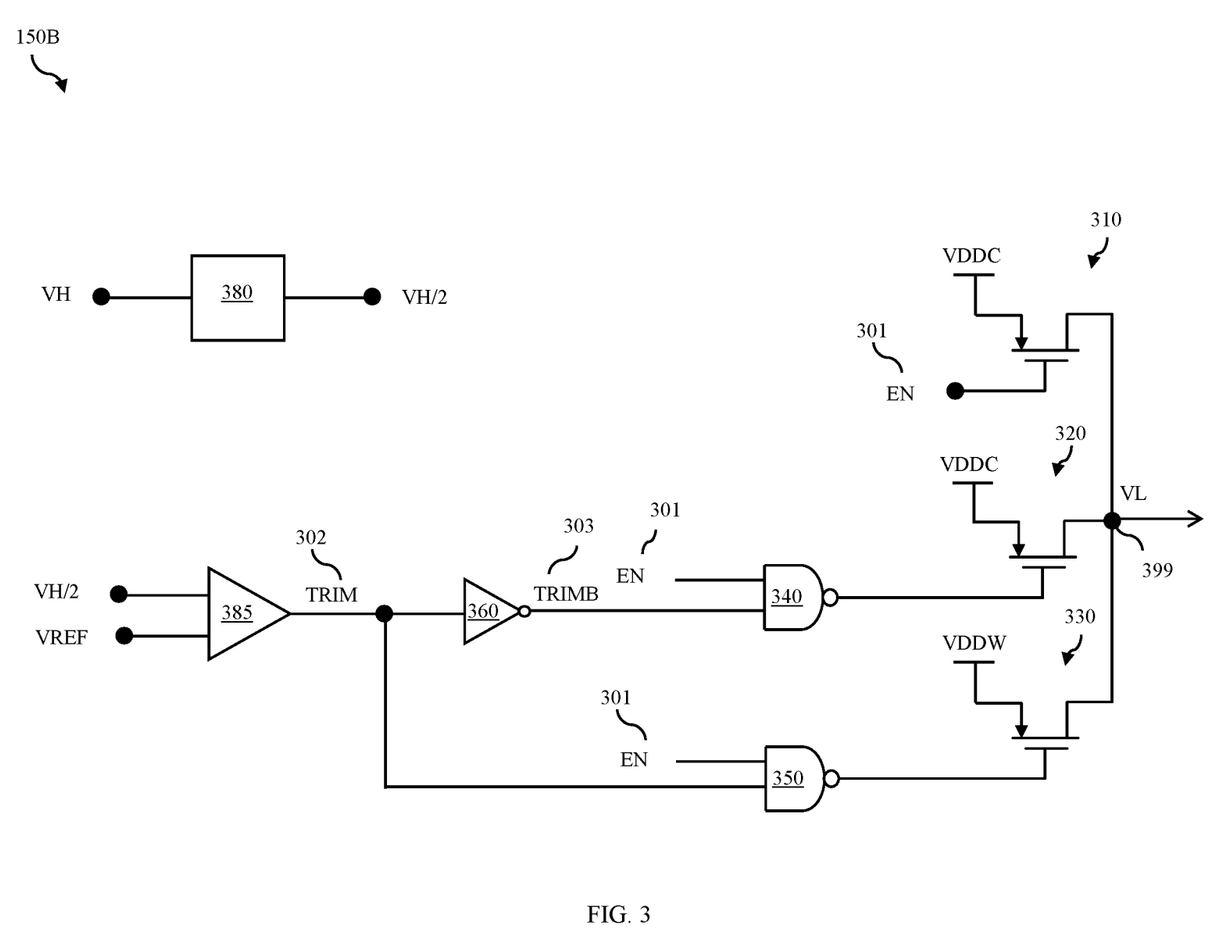
FIG. 3 is a circuit diagram illustrating another example of a variable voltage generator that can be incorporated into the structure of FIG. 1.

FIG. 3 is a schematic diagram illustrating another example of a variable voltage generator 150B that can be incorporated into the circuit structure 199 of FIG. 1 for supplying a VH-dependent VL to the low supply voltage node 191 of the voltage level shifter 100. In this example, the variable voltage generator 150B is specifically configured to track VH through direct monitoring.

Specifically, the variable voltage generator 150B can include: a voltage divider 380; a comparator 385; an inverter 360; a pair of NAND gates (i.e., a first NAND gate 340 and a second NAND gate 350); three PFETs (i.e., a first PFET 310, a second PFET 320, and a third PFET 330); and an output voltage node 399. The output voltage node 399 can be electrically connected to the low supply voltage node 191 of the voltage level shifter 100 for supplying the VL to the low supply voltage node 191.

Figure 4:
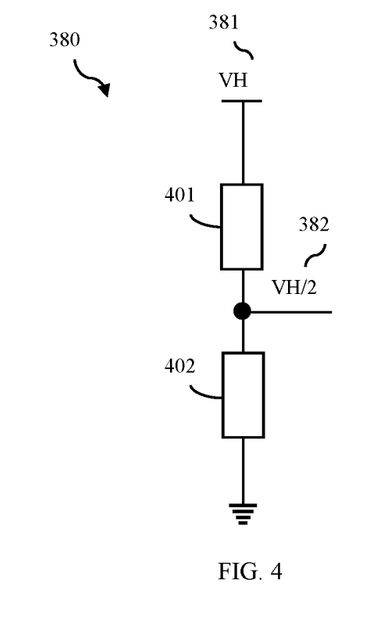
FIG. 4 is a circuit diagram illustrating an example of a voltage divider that can be incorporated into the variable voltage generator of FIG. 3.

Voltage divider 380 can be connected to receive VH from the programmable voltage generator 155. The voltage divider 380 can further be configured to divide VH essentially in half (e.g., half+/−10%) and, more particularly, to output an output voltage that is essentially half the magnitude of VH (i.e., VH/2). FIG. 4 is a schematic diagram illustrating an example of a voltage divider 380 that can be incorporated into the variable voltage generator 150B. As illustrated, this simple voltage divider can include a pair of resistors 401, 402 connected in series between an input node for receiving VH and ground. VH/2 can be output at the junction between the two resistors 401, 402. The voltage divider shown in FIG. 4 is provided for illustration purposes. Alternatively, any other suitable voltage divider circuit could be employed to generate and output VH/2 from VH.

Comparator 385 can be connected to receive, as inputs, VH/2 and a reference voltage (VREF), respectively. VREF can be at some predetermined voltage level between the high second VH level divided by two and the low first VH level divided by two. For example, if the high second VH level is 3.6V so that high VH/2 is 1.8V and if the medium third VH level at 2.6V so that the medium third VH level divided by two is 1.3V, then VREF can be equal to or greater than 1.3V but less than 1.8V. Comparator 385 can further be configured to compare VH/2 to VREF and to internally generate and output a trim bit signal (TRIM 302) based on the results of the comparison. Specifically, comparator 385 can output TRIM 302 at a logic 0, when VH/2 is less equal to or less than VREF, whereas comparator 385 can output TRIM 302 at a logic 1, when VH/2 is greater than VREF.

The remaining components of the variable voltage generator 150B can be essentially the same as the components of the variable voltage generator 150A, described above. Specifically, the first PFET 310 can include: a source region, which is electrically connected to receive VDDC (e.g., at 0.8V); a drain region, which is electrically connected to the output voltage node 399; and a gate, which is electrically connected to receive EN 301. The second PFET 320 can include: a source region, which is electrically connected to receive VDDC; a drain region, which is electrically connected to the output voltage node 399; and a gate, which is electrically connected to receive an output signal from the first NAND gate 340. The third PFET 330 can include: a source region, which is connected to receive VDDW; a drain region, which is connected to the output voltage node 399; and a gate, which is electrically connected to receive an output signal from the second NAND gate 350. The inverter 360 can be electrically connected to receive, as an input, TRIM 302 (which in this case has been internally generated) and can be configured to output an inverted trim bit signal (TRIMB) 303 (i.e., TRIMB 303 is inverted with respect to TRIM 302). The first NAND gate 340 can be electrically connected to receive, as inputs, EN 301 and TRIMB 303, respectively, and can be configured to output a first NAND gate output signal (according to a conventional NAND gate truth table). The second NAND gate 350 can be electrically connected to receive, as inputs, EN 301 and TRIM 302, respectively, and can be configured to output a second NAND gate output signal (according to a conventional NAND gate truth table).

In operation, the on/off state of the first PFET 310 is controlled by EN 301, the on/off state of the second PFET 320 is controlled by the output signal from the first NAND gate 340, and the on/off state of the third PFET 330 is controlled by the output signal from the second NAND gate 350. When EN 301 is low, the first PFET 310 turns on. Additionally, the output signals from the first and second NAND gates 340 and 350 will both be high so the second PFET 320 and the third PFET 330 will be off. Thus, a VL at the low first VL level of VDDC (e.g., at 0.8V) will be supplied by the first PFET 310 to the output voltage node 399 and, thereby to the low supply voltage node 191 of the voltage level shifter 100. When EN 301 is high, TRIM 302 is low and TRIMB 303 is high, the first PFET 310 is off the output signal from the second NAND gate 350 is high so the third PFET 330 is off, and the output signal from first NAND gate 340 is low so the second PFET 320 turns on. Thus, a VL at the low first VL level of VDDC (e.g., at 0.8V) is supplied through the second PFET 320 to the output voltage node 399 and, thereby to the low supply voltage node 191 of the voltage level shifter 100. Finally, when EN 301 is high, TRIM 302 is high, and TRIMB 303 is low, the first PFET 310 turns off, the output signal from the first NAND gate 340 is high so the second PFET 320 turns off, and the output signal from the second NAND gate 350 is low so the PFET 330 turns on. Thus, a VL at the high second VL level of VDDW (e.g., at 1.8V) is supplied through the third PFET 330 to the output voltage node 299 and, thereby to the low supply voltage node 191 of the voltage level shifter 100.

Referring again to FIG. 1, the voltage level shifter 100 can include symmetric branches 101a-101b connected in parallel between the low supply voltage node 191 and the high supply voltage node 192.

Each branch 101a, 101b can include a first PFET 110a, 110b and a second PFET 120a, 120b connected in series between low supply voltage node 191 and high supply voltage node 192. That is, first PFET 110a, 110b can include a drain region 113a, 113b electrically connected to low supply voltage node 191, a gate 112a, 112b, and a source region 111a, 111b. Second PFET 120a, 120b can include a drain region 123a, 123b electrically connected to source region 111a, 111b of first PFET 110a, 110b, a gate 122a, 122b, and a source region 121a, 121b electrically connected to high supply voltage node 192. In some embodiments, source region 111a, 111b of first PFET 110a, 110b and drain region 123a, 123b of the second PFET 120a, 120b can be a shared source/drain region. In other embodiments, source region 111a, 111b of the first PFET 110a, 110b and drain region 123a, 123b of the second PFET 120a, 120b could be discrete regions electrically connected by an interconnect.

Each branch 101a, 101b can further include an intermediate output node 125a, 125b and a third PFET 130a, 130b electrically connected to a junction 116a, 116b between first PFET 110a, 110b and second PFET 120a, 120b. Third PFET 130a, 130b can specifically include: a source region 131a, 131b, which is electrically connected to junction 116a, 116b between first PFET 110a, 110b and second PFET 120a, 120b; a drain region 133a, 133b, which is electrically connected to a final output node 135a, 135b and also to gate 112a, 112b of first PFET 110a, 110b, and a gate 132a, 132b, which is electrically connected to, e.g., low supply voltage node 191, so as to receive VL.

Additionally, the second PFET 120a of branch 101a and second PFET 120b of branch 101b can be cross-coupled. That is, gate 122a of second PFET 120a in branch 101a can be electrically connected to junction 116b between first PFET 110b and second PFET 120b in branch 101b, while gate 122b of second PFET 120b in branch 101b can be electrically connected to junction 116a between first PFET 110a and second PFET 120a in branch 101a.

Finally, each branch 101a, 101b can further include an NFET 140a, 140b (also referred to herein as a pass-gate NFET). NFET 140a, 140b can include: a source region 141a, 141b, which is electrically connected to an input node 145a, 145b; a drain region 143a, 143b, which is electrically connected to final output node 135a, 135b (and thereby electrically connected to the drain region 133a, 133b of third PFET 130a, 130b as well as gate 112a, 112b of first PFET 110a, 110b); and a gate, which is electrically connected to receive a pass-gate control voltage that is, for example, equal to the maximum voltage rating (VDDW) of the transistors therein (e.g., 1.8V).

The voltage level shifter 100 can further be connected to receive two input voltage pulses at the two input nodes 145a and 145b, respectively. Input voltage pulse (IN) at input node 145a can transition between VDDW (e.g., at 1.8V) and ground (GND) (e.g., at 0.0V). An inverted input voltage pulse (INB) at input node 145b can be inverted with respect to IN and, thus, can transition from GND to VDDW as IN transitions from VDDW to GND and vice versa.

For purposes of this disclosure, a "voltage pulse" refers to an essentially rectangular direct current voltage signal that transitions between a low voltage level and a high voltage level at regular and repeated intervals such that the pulse is at the low voltage level for a first time period (T1), switches to the high voltage level and remains at the high voltage level for a second time period (T2) (which is the same as or different from T1), switches back to the low voltage level and again remains at the low voltage level for T1, and so on.

The voltage level shifter 100 can further be configured to generate and output four different output voltage pulses including two intermediate output voltage pulses at intermediate output nodes 125a-125b and two final output voltage pulses at final output nodes 135a-135b. The two intermediate output voltage pulses can include intermediate output voltage pulse (OUT$_i$), which will transition between VL and VH, at intermediate output node 125b and inverted intermediate output voltage pulse (OUTB$_i$), which is inverted with respect to OUT$_i$ and, thus, will transition from VH to VL as OUT$_i$ transitions from VL to VH and vice versa, at intermediate output node 125a. The two final output voltage pulses can include final output voltage pulse (OUT), which transitions between ground and VH, at a final output node 135b and inverted final output voltage pulse (OUTB), which is inverted with respect to OUT and, thus, which transitions from VH to ground as OUT transitions from ground to VH and vice versa, at final output node 135a.

Figure 5:
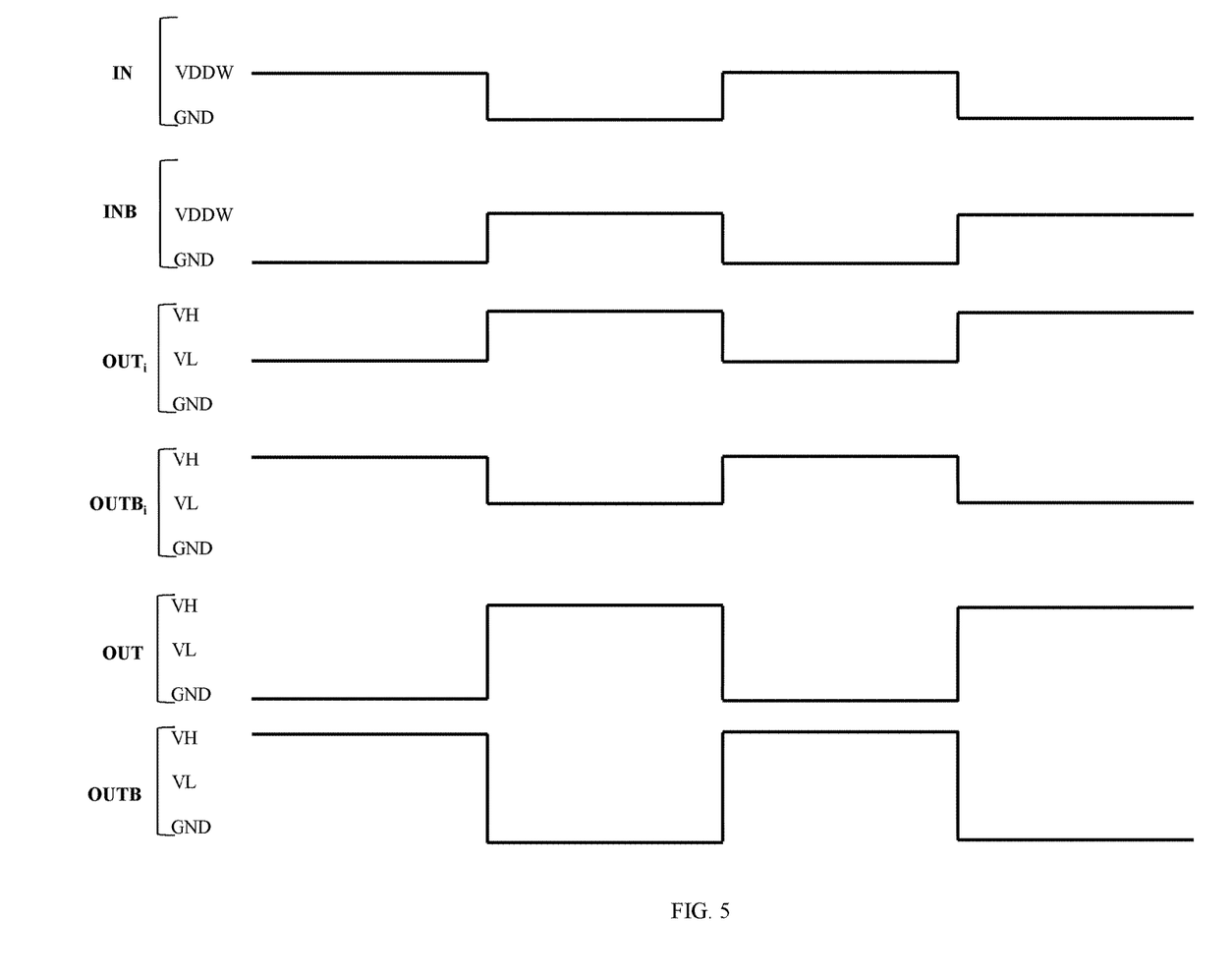
FIG. 5 is a timing diagram illustrating input voltage pulses to and output voltage pulses from the structure of FIG. 1.

FIG. 5 shows an example of a timing diagram illustrating input voltage pulses (IN, INB) to a voltage level shifter 100 and output voltage pulses (OUT$_i$, OUTB$_i$, OUT, OUTB) from the voltage level shifter 100, when the voltage level of VH is programmable (e.g., to 3.6V, 2.6V, or 1.8V) and when the voltage level of VL is automatically adjusted based on VH (e.g., when VH=3.6V, VL=1.8V; when VH=2.6V, VL=0.8V; and when VH=1.8V, VL=0.8V).

In operation, VDDW is continuously applied to gates 142a, 142b of NFETs 140a, 140b, VL is continuously applied to gates 132a, 132b of third PFETs 130a, 130b. When IN transitions from GND to VDDW and INB transitions from VDDW to GND, in branch 101b, gate and source voltages of NFET 140b are at VDDW and GND, respectively, so the threshold voltage (VT) of NFET 140b is reached. NFET 140b turns on and pulls down the voltage on final output node 135b to GND so OUT is at GND. When the voltage on final output node 135b is at GND, gate voltage on first PFET 110b is at GND and the VT of first PFET 110b is reached. First PFET 110b turns on, pulling down the voltage at intermediate output node 125b to VL so OUT$_i$ is at VL. The gate and source voltages on third PFET 130b are both at VL, so third PFET 130b remains off. In branch 101a the gate voltage on second PFET 120a is at VL and the source voltage is at VH, so the VT of second PFET 120a is reached. Second PFET 120a turns on, thereby pulling up the voltage on intermediate output node 125a to VH so OUTB$_i$ goes to VH. When intermediate output node 125a is at VH, the second PFET 120b remains off. Furthermore, the gate and source voltages on third PFET 130a are VL and VH, respectively, so the VT of third PFET 130a is reached. Third PFET 130a turns on, pulling up the voltage on final output node 135a to VH so OUTB goes to VH. Third PFET 130a also pulls the gate voltage of first PFET 110a up to VH, so first PFET 110a remains off. Since the gate and source voltages of NFET 140a are both at VDDW, NFET 140a also remains off.

When IN transitions from VDDW to GND and INB transitions from GND to VDDW, the reverse occurs. In branch 101a, gate and source voltages on NFET 140a are at VDDW and GND, respectively, so the VT of NFET 140a is reached. NFET 140a turns on and pulls down the voltage on final output node 135a to GND so OUTB is at GND. When the voltage on final output node 135a is GND, the gate voltage on first PFET 110a is at GND and the VT of first PFET 110a is reached. First PFET 110a turns on, pulling down the voltage at intermediate output node 125a to VL so OUTB$_i$ is at VL. The gate and source voltages of third PFET 130a are both at VL, so third PFET 130a remains off. Additionally, in branch 101b the gate voltage on second PFET 120b is at VL and the source voltage is at VH, so the VT of second PFET 120b is reached. Second PFET 120b turns on, thereby pulling up the voltage on intermediate output node 125b to VH so OUT$_i$ goes to VH. When intermediate output node 125b is at VH, second PFET 120a remains off. Furthermore, the gate and source voltages on third PFET 130b are VL and VH, respectively, so the VT of third PFET 130b is reached. Third PFET 130b turns on, pulling up the voltage on final output node 135b to VH so OUT goes to VH. Third PFET 130b also pulls up the gate voltage on first PFET 110b to VH, so first PFET 110b remains off. Since the gate and source voltages on NFET 140b are both at VDDW, NFET 140b also remains off.

Thus, as illustrated, OUT$_i$ at intermediate output node 125b transitions between VL and VH and back (regardless of whether VL is at 1.8V and VH is at 3.6V or VL is at 0.8V and VH is at either 2.6V or 1.8V) and OUTB$_i$ at intermediate output node 125a is inverted with respect to OUT$_i$ (i.e., transitions from VH to VL when OUT$_i$ transitions from VL to VH and vice versa). Additionally, OUT at final output node 135b transitions between GND and VH and back (again regardless of whether VL is at 1.8V and VH is at 3.6V or VL is at 0.8V and VH is at either 2.6V or 1.8V) and OUTB at final output node 135a is inverted with respect to OUT (i.e., transitions from VH to GND when OUT transitions from GND to VH and vice versa).

In the disclosed circuit structure 199, the variable voltage generator 150A or 150B allows the voltage level of VL to be shifted upwards (e.g., from 0.8V to 1.8V) when the voltage level of VH is relatively high, e.g., at 3.6V. Thus, all transistors 110a-110b, 120a-120b, 130a-130b, 140a-140b that are incorporated into the voltage level shifter 100 can be low voltage (e.g., 1.8V) symmetric transistors without risking operation outside the SOA for such transistors. In the example provided, the output voltage pulses would be as follows: OUT$_i$ transitions between 1.8V and 3.6V, OUTB$_i$ is inverted with respect to OUT$_i$; OUT transitions between GND and 3.6V, and OUTB is inverted with respect to OUT. The variable voltage generator 150A or 150B also provides a means by which the voltage level of VL can be shifted downwards (e.g., from 1.8V to 0.8V) when, for whatever reason, a lower VH is desirable (e.g., to reduce power consumption). Those skilled in the art will recognize that in the above-described circuit structure, VH at a medium third VH level (e.g., of 2.6V) in combination with VL at a high second VL level (e.g., of 1.8V) would still leave the voltage level shifter operable; however, the switching speed of the transistors therein would be reduced. By automatically adjusting the voltage level of VL downwards (e.g., from 1.8V to 0.8V) when the medium third VH level (e.g., of 2.6V) is employed, the switching speed of the transistors is boosted, and performance is thereby improved. Those skilled in the art will also recognize that, in the above-described circuit structure, VH at a low first VH level (e.g., of 1.8V) in combination with VL at the high second VL level (e.g., of 1.8V) would leave the voltage level shifter inoperable because the threshold voltages of the transistors therein could not be reached. By automatically adjusting the voltage level of VL downward (e.g., from 1.8V to 0.8V) when VH is at the low first VH level (e.g., of 1.8 volts), the voltage level shifter remains operable.

In the above-described embodiments, body biasing of the transistors within the voltage level shifter 100 can also be employed, as indicated to FIG. 1, to improve transistor switching speeds.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a voltage level shifter including a low supply voltage node and a high supply voltage node;
   a programmable voltage generator outputting a high supply voltage to the high supply voltage node; and
   a variable voltage generator outputting a low supply voltage to the low supply voltage node, wherein the low supply voltage is dependent on and lower than the high supply voltage.

2. The structure of claim 1, wherein the voltage level shifter receives an input voltage pulse that transitions between an input voltage and ground and outputs multiple output voltage pulses including an intermediate output voltage pulse that transitions between the low supply voltage and the high supply voltage and a final output voltage pulse that transitions between ground and the high supply voltage.

3. The structure of claim 2,
   wherein the voltage level shifter further includes multiple transistors, and
   wherein the multiple transistors have the same voltage rating equal to the input voltage.

4. The structure of claim 3, wherein the multiple transistors are symmetric transistors.

5. The structure of claim 2,
   wherein the programmable voltage generator is programmable to generate and output any of a first high supply voltage equal to the input voltage and a second high supply voltage essentially double the input voltage,
   wherein, when the programmable voltage generator outputs the first high supply voltage, the variable voltage generator outputs a first low supply voltage lower than the input voltage, and
   wherein, when the programmable voltage generator outputs the second high supply voltage, the variable voltage generator outputs a second low supply voltage equal to the input voltage.

6. The structure of claim 5,
   wherein the programmable voltage generator is further programmable to output a third high supply voltage between the first high supply voltage and the second high supply voltage, and
   wherein, when the programmable voltage generator outputs the third high supply voltage, the variable voltage generator outputs the first low supply voltage.

7. The structure of claim 2,
   wherein the input voltage is 1.8 volts,
   wherein the high supply voltage is programmable to any of a 1.8-volt high supply voltage and a 3.6-volt high supply voltage,
   wherein, when the programmable voltage generator outputs the 1.8-volt high supply voltage, the variable voltage generator outputs a 0.8-volt low supply voltage, and
   wherein, when the programmable voltage generator outputs the 3.6-volt high supply voltage, the variable voltage generator outputs a 1.8-volt low supply voltage.

8. The structure of claim 7,
   wherein the high supply voltage is further programmable to a 2.6-volt high supply voltage, and
   wherein, when the programmable voltage generator outputs the 2.6-volt high supply voltage, the variable voltage generator outputs the 0.8-volt low supply voltage.

9. The structure of claim 2, wherein the voltage level shifter includes:
   two input nodes receiving two input voltage pulses, respectively, wherein the two input voltage pulses include the input voltage pulse and an inverted input voltage pulse; and
   four output nodes outputting, in response to the two input voltage pulses, four output voltage pulses, respectively, wherein the four output voltage pulses include the final output voltage pulse, an inverted final output voltage pulse, the intermediate output voltage pulse, and an inverted intermediate output voltage pulse.

10. The structure of claim 9,
wherein the voltage level shifter further includes two branches connected between the low supply voltage node and the high supply voltage node, and
wherein each branch includes:
   an input node;
   an intermediate output node;
   an output node;
   a first P-type transistor;
   a second P-type transistor, wherein the first P-type transistor and the second P-type transistor are connected in series between the low supply voltage node and the high supply voltage node and wherein the intermediate output node is at a junction between the first P-type transistor and the second P-type transistor;
   a third P-type transistor having a source region connected to the junction, a gate connected to receive the low supply voltage, and a drain region connected to a gate of the first P-type transistor and to the output node; and
   an N-type transistor having a source region connected to the input node, a gate connected to receive the input voltage, and a drain connected to the output node,
   wherein, between the two branches, second P-type transistors are cross-coupled.

11. A structure comprising:
a voltage level shifter including a low supply voltage node and a high supply voltage node;
a programmable voltage generator receiving a trim bit signal and, based on the trim bit signal, outputting a high supply voltage to the high supply voltage node; and
a variable voltage generator outputting a low supply voltage to the low supply voltage node,
wherein the variable voltage generator further receives the trim bit signal and generates and outputs the low supply voltage based on the trim bit signal, and
wherein the low supply voltage is lower than the high supply voltage.

12. The structure of claim 11,
wherein the voltage level shifter receives multiple input voltage pulses and, in response to the multiple input voltage pulses, outputs multiple output voltage pulses including an intermediate output voltage pulse that transitions between the low supply voltage and the high supply voltage and a final output voltage pulse that transitions between ground and the high supply voltage,
wherein the programmable voltage generator is programmable to generate and output any of a first high supply voltage equal to an input voltage, a second high supply voltage essentially double the input voltage, and a third high supply voltage between the first high supply voltage and the second high supply voltage,
wherein, when the programmable voltage generator outputs either the first high supply voltage or the third high supply voltage, the variable voltage generator outputs a first low supply voltage lower than the input voltage, and
wherein, when the programmable voltage generator outputs the second high supply voltage, the variable voltage generator outputs a second low supply voltage equal to the input voltage.

13. The structure of claim 12, wherein the variable voltage generator includes:
   an output voltage node connected to the low supply voltage node;
   a first P-type transistor with a source region connected to receive the first low supply voltage, a drain region connected to the output voltage node, and a gate connected to receive an enable signal;
   a second P-type transistor with a source region connected to receive the first low supply voltage, a drain region connected to the output voltage node, and a gate connected to a first output of a first NAND gate;
   a third P-type transistor with a source region connected to receive the second low supply voltage, a drain region connected to the output voltage node, and a gate connected to a second output of a second NAND gate; and
   an inverter connected to receive the trim bit signal and configured to output an inverted trim bit signal,
   wherein the first NAND gate is connected to receive the enable signal and the inverted trim bit signal, and
   wherein the second NAND gate is connected to the enable signal and the trim bit signal.

14. The structure of claim 13,
wherein the enable signal controls the first P-type transistor,
wherein output signals from the first NAND gate and the second NAND gate control the second P-type transistor and the third P-type transistor, respectively,
wherein, when the enable signal is at a low logic level, the first P-type transistor turns on and the second P-type transistor and the third P-type transistor turn off, so that the first low supply voltage is supplied to the low supply voltage node of the voltage level shifter through the output voltage node,
wherein, when the enable signal has a high logic level and the trim bit signal has the low logic level, the second P-type transistor turns on and the first P-type transistor and the third P-type transistor turn off, so that the first low supply voltage is supplied to the low supply voltage node of the voltage level shifter through the output voltage node, and
wherein, when the enable signal and the trim bit signal have the high logic level, the first P-type transistor and the second P-type transistor turn off and the third P-type transistor turns on, so that the second low supply voltage is supplied to the low supply voltage node through the output voltage node.

15. The structure of claim 12,
wherein the input voltage is 1.8 volts,
wherein the high supply voltage is programmable to any of a 1.8-volt high supply voltage, a 2.6-volt high supply voltage, and a 3.6-volt high supply voltage,
wherein, when the programmable voltage generator outputs either the 1.8-volt high supply voltage or the 2.6-volt high supply voltage, the variable voltage generator outputs a 0.8-volt low supply voltage, and
wherein, when the programmable voltage generator outputs the 3.6-volt high supply voltage, the variable voltage generator outputs a 1.8-volt low supply voltage.

16. A structure comprising:
a voltage level shifter including a low supply voltage node and a high supply voltage node;
a programmable voltage generator outputting a high supply voltage to the high supply voltage node; and
a variable voltage generator outputting a low supply voltage to the low supply voltage node, wherein the variable voltage generator receives the high supply voltage, internally generates a trim bit signal based on the high supply voltage, and generates and outputs the low supply voltage based on the trim bit signal, and wherein the low supply voltage is lower than the high supply voltage.

17. The structure of claim 16, wherein the voltage level shifter receives an input voltage pulse that transitions between an input voltage and ground and further outputs, in response to the input voltage pulse, multiple output voltage pulses including an intermediate output voltage pulse that transitions between the low supply voltage and the high supply voltage and a final output voltage pulse that transitions between ground and the high supply voltage, wherein the high supply voltage is programmable to any of a first high supply voltage equal to the input voltage, a second high supply voltage essentially double the input voltage, and a third high supply voltage between the first high supply voltage and the second high supply voltage, wherein, when the programmable voltage generator outputs either the first high supply voltage or the third high supply voltage, the variable voltage generator outputs a first low supply voltage lower than the input voltage, and wherein, when the programmable voltage generator outputs the second high supply voltage, the variable voltage generator outputs a second low supply voltage equal to the input voltage.

18. The structure of claim 17, wherein the variable voltage generator includes:

a voltage divider receiving the high supply voltage and outputting a divided high supply voltage;

a comparator receiving the divided high supply voltage and a reference voltage and outputting the trim bit signal, wherein the trim bit signal is at a high logic level when the divided high supply voltage is greater than the reference voltage and at a low logic level when the divided high supply voltage is less than or equal to the reference voltage;

an output voltage node connected to the low supply voltage node;

a first P-type transistor with a source region connected to receive the first low supply voltage, a drain region connected to the output voltage node, and a gate connected to receive an enable signal;

a second P-type transistor with a source region connected to receive the first low supply voltage, a drain region connected to the output voltage node, and a gate connected to a first output of a first NAND gate;

a third P-type transistor with a source region connected to receive the second low supply voltage, a drain region connected to the output voltage node, and a gate connected to a second output of a second NAND gate; and an inverter receiving the trim bit signal and outputting an inverted trim bit signal, wherein the first NAND gate receives the enable signal and the inverted trim bit signal, and wherein the second NAND gate receives the enable signal and the trim bit signal.

19. The structure of claim 18, wherein the enable signal controls the first P-type transistor, wherein output signals from the first NAND gate and the second NAND gate control the second P-type transistor and the third P-type transistor, respectively, wherein, when the enable signal has a low logic level, the first P-type transistor turns on and the second P-type transistor and the third P-type transistor turn off, so that the first low supply voltage is supplied to the low supply voltage node of the voltage level shifter through the output voltage node, wherein, when the enable signal has a high logic level and the trim bit signal has the low logic level, the second P-type transistor turns on and the first P-type transistor and the third P-type transistor turn off, so that the first low supply voltage is supplied to the low supply voltage node of the voltage level shifter through the output voltage node, and wherein, when the enable signal and the trim bit signal have the high logic level, the first P-type transistor and the second P-type transistor turn off and the third P-type transistor turns on, so that the second low supply voltage is supplied to the low supply voltage node through the output voltage node.

20. The structure of claim 17, wherein the input voltage is 1.8 volts, wherein the high supply voltage is programmable to any of a 1.8-volt high supply voltage, a 2.6-volt high supply voltage, and a 3.6-volt high supply voltage, wherein, when the programmable voltage generator outputs either the 1.8-volt high supply voltage or the 2.6-volt high supply voltage, the variable voltage generator outputs a 0.8-volt low supply voltage, and wherein, when the programmable voltage generator outputs the 3.6-volt high supply voltage, the variable voltage generator outputs a 1.8-volt low supply voltage.

* * * * *